US010203911B2

United States Patent
Lopez et al.

(10) Patent No.: US 10,203,911 B2
(45) Date of Patent: Feb. 12, 2019

(54) CONTENT ADDRESSABLE MEMORY (CAM) IMPLEMENTED TUPLE SPACES

(71) Applicant: Friday Harbor LLC, New York, NY (US)

(72) Inventors: Ricardo Jorge Lopez, San Marcos, CA (US); Ramon Zuniga, San Diego, CA (US); Robert Nicholas Hilton, San Diego, CA (US)

(73) Assignee: Friday Harbor LLC, New York, NY (US)

( * ) Notice: Subject to any disclaimer, the term of this patent is extended or adjusted under 35 U.S.C. 154(b) by 77 days.

(21) Appl. No.: 15/157,982

(22) Filed: May 18, 2016

(65) Prior Publication Data

US 2017/0337295 A1    Nov. 23, 2017

(51) Int. Cl.
   *G06F 3/00*     (2006.01)
   *G06F 3/06*     (2006.01)
   *G11C 15/00*    (2006.01)

(52) U.S. Cl.
   CPC ............ *G06F 3/0683* (2013.01); *G06F 3/061* (2013.01); *G06F 3/0647* (2013.01); *G11C 15/00* (2013.01)

(58) Field of Classification Search
   CPC .. G06F 17/30982; G06F 3/061; G06F 3/0647; G06F 3/0683
   See application file for complete search history.

(56) References Cited

U.S. PATENT DOCUMENTS

| 5,517,642 | A  | * | 5/1996 | Bezek | ...................... | G06F 7/483 |
| 5,615,360 | A  | * | 3/1997 | Bezek | ...................... | G06F 7/483 |
| 6,717,946 | B1 | * | 4/2004 | Hariguchi | .......... | G06F 17/30985 370/389 |
| 6,934,795 | B2 | * | 8/2005 | Nataraj | ............. | G06F 17/30982 707/E17.035 |
| 7,216,204 | B2 | * | 5/2007 | Rosenbluth | ......... | G06F 9/30021 711/141 |
| 7,389,462 | B1 | * | 6/2008 | Wang | ...................... | H04L 1/188 714/748 |
| 2003/0135695 | A1 | * | 7/2003 | Gray | ...................... | G06F 17/30 711/128 |

(Continued)

OTHER PUBLICATIONS

Srinivasan, Venkatachary, Subhash Sud, and George Varghese. "Packet classification using tuple space search." ACM SIGCOMM Computer Communication Review. vol. 29. No. 4. ACM, 1999. (Year: 1999).*

(Continued)

*Primary Examiner* — Francisco A Grullon
(74) *Attorney, Agent, or Firm* — Sheppard Mullin Richter & Hampton LLP

(57) ABSTRACT

A multi-processor system with a portion of content-addressable memory (CAM) configured as a tuple space to control data flow between processing element. A writing processor may write to a tuple space followed by a reading processor reading from the tuple space. However the system may control access to the tuple space so that no read operations may be performed for a particular tuple space before that space is written to. Further, no write operations may be performed to the tuple space prior to previous written data being read from the tuple space. A processor wishing to use the tuple space before being permitted to do so may be stalled, thus controlling data flow between operating processors.

20 Claims, 10 Drawing Sheets

(56) References Cited

U.S. PATENT DOCUMENTS

| | | | | | |
|---|---|---|---|---|---|
| 2004/0103173 | A1* | 5/2004 | Donatelli | ............... | G06F 8/60 |
| | | | | | 709/221 |
| 2006/0277545 | A1* | 12/2006 | Togawa | ............. | G06F 9/3879 |
| | | | | | 718/100 |
| 2007/0033369 | A1* | 2/2007 | Kasama | ............ | G06F 15/8007 |
| | | | | | 711/170 |
| 2013/0061229 | A1* | 3/2013 | Hamada | ............... | G06F 9/46 |
| | | | | | 718/100 |
| 2016/0011994 | A1* | 1/2016 | Bouley | ............. | G06F 13/1663 |
| | | | | | 710/308 |

OTHER PUBLICATIONS

Campbell, Duncan KG. "Tuplets: Words for a tuple space machine." Report-University of York Department of Computer Science YCS (1997). (Year: 1997).*

Wilson, Greg. "Tuple Spaces or Good Ideas Don't Always Win." Software Carpentry, Mar. 1, 2011, https://software-carpentry.org/blog/2011/03/tuple-spaces-or-good-ideas-dont-always-win.html (Year: 2011).*

* cited by examiner

Consumer Register    Producer Register

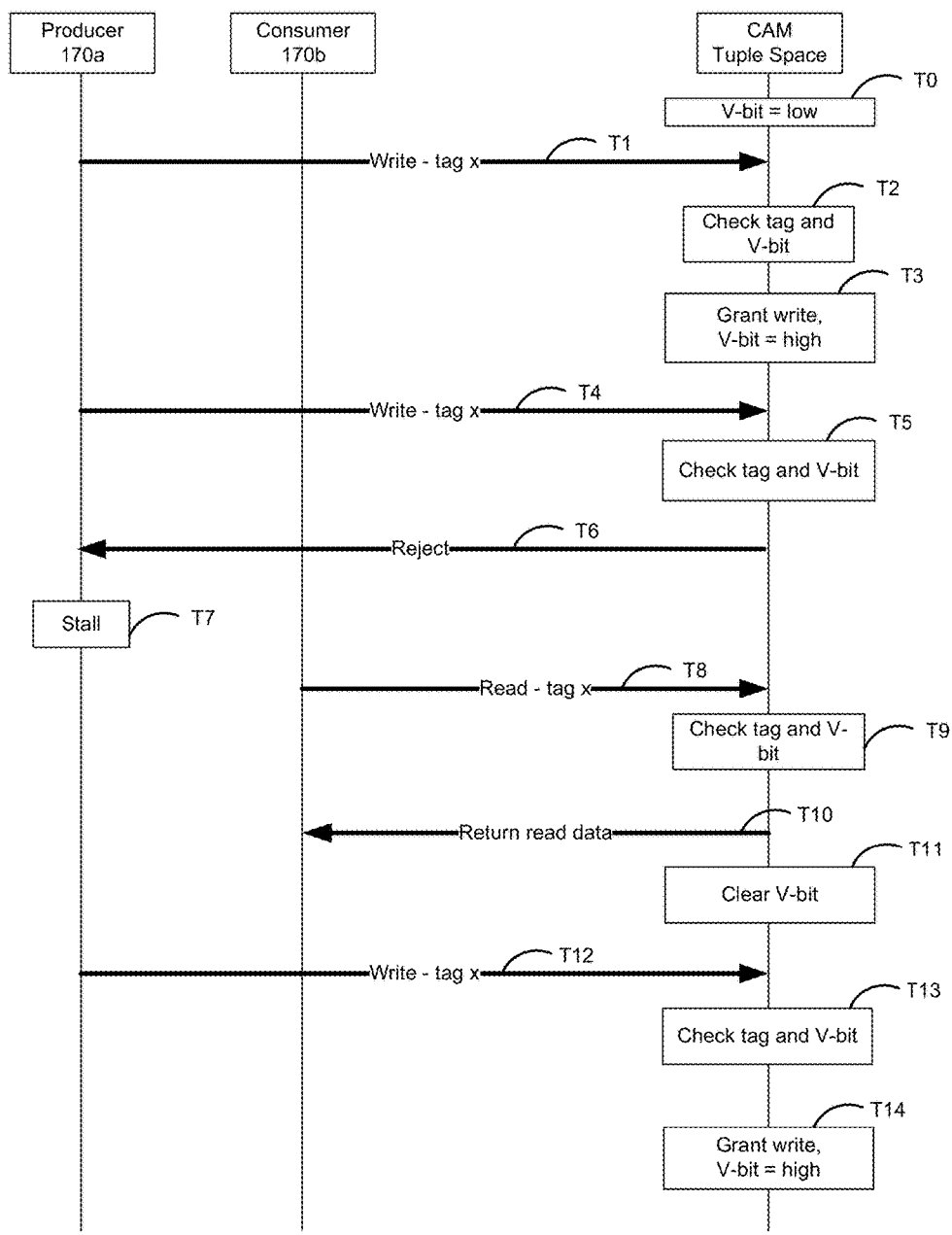

write to the tuple space read to the tuple space

US 10,203,911 B2

CONTENT ADDRESSABLE MEMORY (CAM) IMPLEMENTED TUPLE SPACES

BACKGROUND

In conventional multiprocessor systems, processors may exchange data with each other to facilitate multiprocessor communication. The data exchange may be performed using a direct transport over a link layer. Additionally, the data exchange may be performed using a shared data memory region protected by an exclusion protocol such as a mutual exclusion semaphore or a mutex.

SUMMARY

In one aspect of the present disclosure, a computer implemented method is disclosed. The method includes configuring, in a content addressable memory (CAM), a plurality of locations as a plurality tuple spaces, the plurality of tuple spaces based on a number of processing elements. The method also includes receiving, at the CAM, a read request from a first processing element to perform a read operation from a first tuple space of the plurality of tuple spaces associated with a first tag. The method further includes checking, at the CAM, a first indicator associated with the first tuple space to determine whether a second processing element has performed a write operation to the first tuple space. The method still further includes reading, at the CAM, data from the first tuple space and sending, from the CAM, the data to the first processing element.

Another aspect of the present disclosure is directed to an apparatus including means for configuring, in a CAM, a plurality of locations as a plurality tuple spaces, the plurality of tuple spaces based on a number of processing elements. The apparatus also includes means for receiving, at the CAM, a read request from a first processing element to perform a read operation from a first tuple space of the plurality of tuple spaces associated with a first tag. The apparatus further includes means for checking, at the CAM, a first indicator associated with the first tuple space to determine whether a second processing element has performed a write operation to the first tuple space. The apparatus still further includes means for reading, at the CAM, data from the first tuple space and means for sending, from the CAM, the data to the first processing element.

In another aspect of the present disclosure, a non-transitory computer-readable medium with non-transitory program code recorded thereon is disclosed. The program code includes program code to configure, in a CAM, a plurality of locations as a plurality tuple spaces, the plurality of tuple spaces based on a number of processing elements. The program code also includes program code to receive, at the CAM, a read request from a first processing element to perform a read operation from a first tuple space of the plurality of tuple spaces associated with a first tag. The program code further includes program code to check, at the CAM, a first indicator associated with the first tuple space to determine whether a second processing element has performed a write operation to the first tuple space. The program code still further includes program code to read, at the CAM, data from the first tuple space and program code to send, from the CAM, the data to the first processing element.

Another aspect of the present disclosure is directed to a multiprocessor integrated on a semiconductor chip having multiple processors and a CAM including multiple locations configured as multiple tuple spaces. The multiple of tuple spaces based on a number of processing elements. The CAM is configured to configure, in a CAM, a plurality of locations as a plurality tuple spaces, the plurality of tuple spaces based on a number of processing elements. The CAM is also configured to receive, at the CAM, a read request from a first processing element to perform a read operation from a first tuple space of the plurality of tuple spaces associated with a first tag. The CAM is further configured to check, at the CAM, a first indicator associated with the first tuple space to determine whether a second processing element has performed a write operation to the first tuple space. The CAM is still further configured to read, at the CAM, data from the first tuple space and to send, from the CAM, the data to the first processing element Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF DRAWINGS

For a more complete understanding of the present disclosure, reference is now made to the following description taken in conjunction with the accompanying drawings.

FIGS. 4A, 4B, and 4C illustrate examples of performing read/writes to a CAM in a multiprocessor system according to embodiments of the present disclosure.

DETAILED DESCRIPTION

Figure 1:
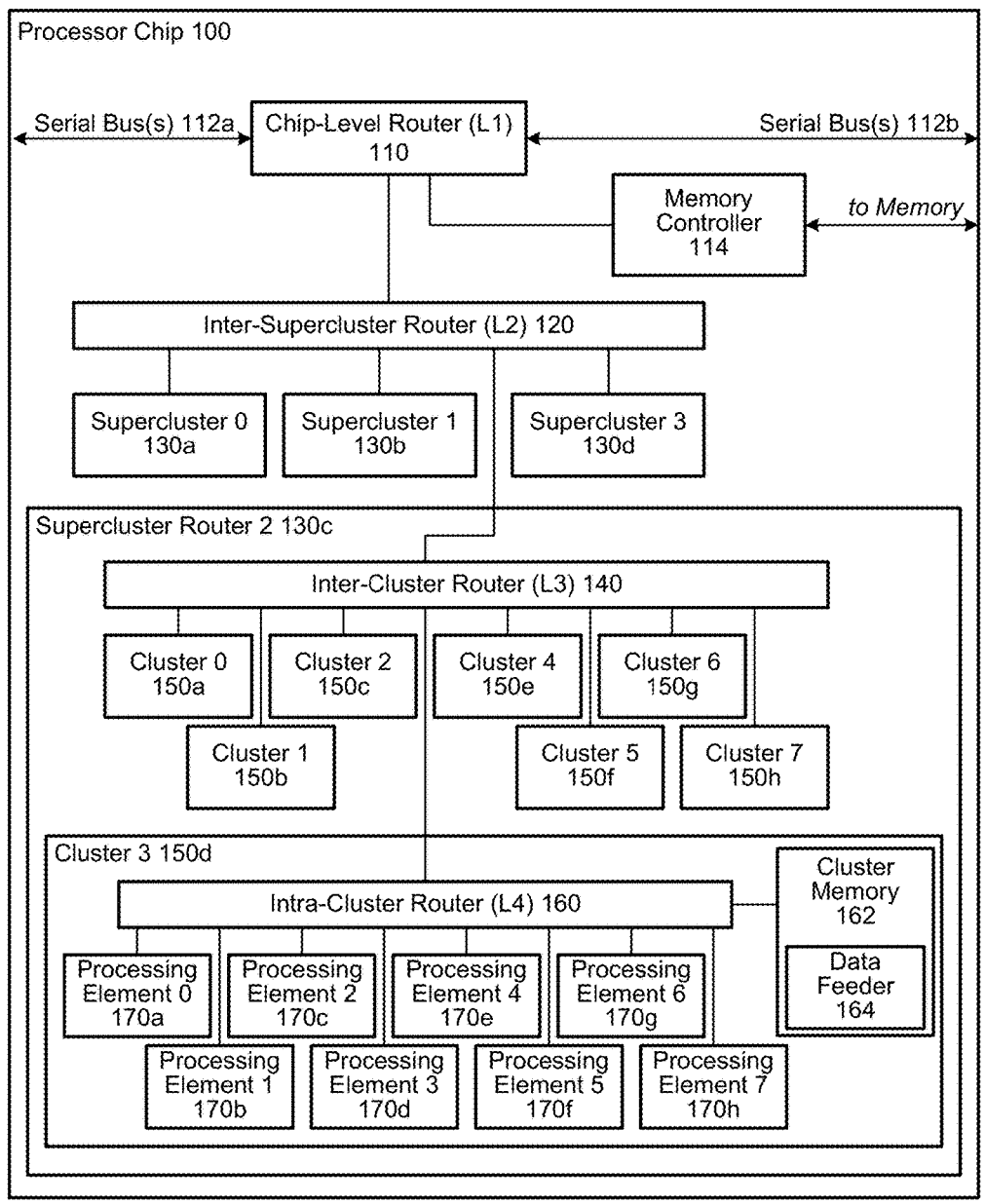
FIG. 1 is a block diagram conceptually illustrating an example of a network-on-a-chip architecture that supports inter-element register communication.

One widely used method for communication between processors in conventional parallel processing systems is for one processing element (e.g., a processor core and associated peripheral components) to write data to a location in a shared general-purpose memory, and another processing element to read that data from that memory. In such systems, processing elements typically have little or no direct communication with each other. Instead, processes exchange data by having a source processor store the data in a shared memory, and having the target processor copy the data from the shared memory into its own internal registers for processing.

This method is simple and straightforward to implement in software, but suffers from substantial overhead. Memory reads and writes require substantial time and power to execute. Furthermore, general-purpose main memory is usually optimized for maximum bandwidth when reading/writing large amounts of data in a stream. When only a small amount of data needs to be written to memory, transmitting data to memory carries relatively high latency. Also, due to network overhead, such small transactions may disproportionally reduce available bandwidth.

Further, a data exchange using a transport over a link layer may be undesirable because of the costs in time, power, and/or overhead. Furthermore, for a data exchange using a transport over a link layer, a lack of direct acknowledgement of the successful data transport may cause additional resources to be used across the link layer in the reverse direction.

Additionally, a shared data memory region protected by a mutual exclusion protocol may be undesirable due to reduced security in the data exchange. Furthermore, failure to abide by the mutual exclusion protocol may lead to defects which may be difficult to detect. Finally, in most cases, the shared data memory region cannot scale the mutual exclusion protocol to several independent shared memory regions.

In parallel processing systems that may be scaled to include hundreds (or more) of processor cores, what is needed is a method for software running on one processing element to communicate data directly to software running on another processing element, while continuing to follow established programming models, so that (for example) in a typical programming language, the data transmission appears to take place as a simple assignment.

Offered is a tuple space memory configuration using content addressable memory to control data exchange between multiple processing elements. Tuple spaces may consume less time and power in comparison to other exchange protocols. Furthermore, tuple spaces may secure the exchange and provide an automatic indication of the success of the exchange. Thus, tuple spaces offer a robust flexible method to exchange data between concurrent sequences, accommodating several common synchronization patterns used in concurrent software processing over many cores. Still, in conventional systems, tuple spaces are implemented via software. Thus, it is desirable to implement tuple spaces via hardware to improve the speed of a data exchange and to reduce the resources used in a data exchange.

Figure 2:
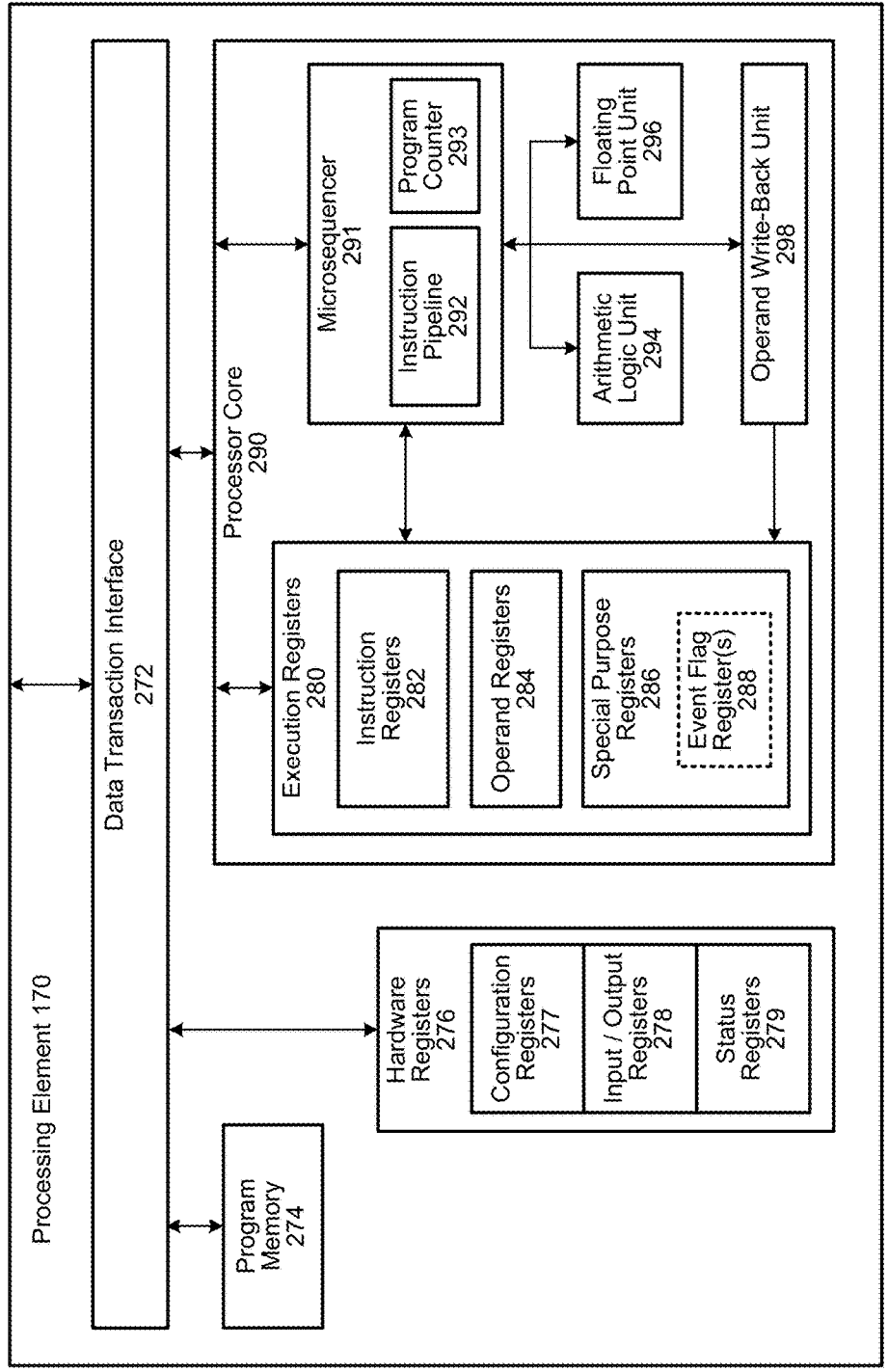
FIG. 2 is a block diagram conceptually illustrating example components of a processing element of the architecture in FIG. 1.

The tuple space memory configuration may be used with a multiprocessor system as shown in FIG. 1. FIG. 1 is a block diagram conceptually illustrating an example of a network-on-a-chip architecture that supports inter-element register communication. A processor chip 100 may be composed of a large number of processing elements 170 (e.g., 256), connected together on the chip via a switched or routed fabric similar to what is typically seen in a computer network. FIG. 2 is a block diagram conceptually illustrating example components of a processing element 170 of the architecture in FIG. 1.

Each processing element 170 has direct access to some (or all) of the operand registers 284 of the other processing elements, such that each processing element 170 may read and write data directly into operand registers 284 used by instructions executed by the other processing element, thus allowing the processor core 290 of one processing element to directly manipulate the operands used by another processor core for opcode execution.

An "opcode" instruction is a machine language instruction that specifies an operation to be performed by the executing processor core 290. Besides the opcode itself, the instruction may specify the data to be processed in the form of operands. An address identifier of a register from which an operand is to be retrieved may be directly encoded as a fixed location associated with an instruction as defined in the instruction set (i.e. an instruction permanently mapped to a particular operand register), or may be a variable address location specified together with the instruction.

Each operand register 284 may be assigned a global memory address comprising an identifier of its associated processing element 170 and an identifier of the individual operand register 284. The originating processing element 170 of the read/write transaction does not need to take special actions or use a special protocol to read/write to another processing element's operand register, but rather may access another processing element's registers as it would any other memory location that is external to the originating processing element. Likewise, the processing core 290 of a processing element 170 that contains a register that is being read by or written to by another processing element does not need to take any action during the transaction between the operand register and the other processing element.

Conventional processing elements commonly include two types of registers: those that are both internally and externally accessible, and those that are only internally accessible. The hardware registers 276 in FIG. 2 illustrate examples of conventional registers that are accessible both inside and outside the processing element, such as configuration registers 277 used when initially "booting" the processing element, input/output registers 278, and various status registers 279. Each of these hardware registers are globally mapped, and are accessed by the processor core associated with the hardware registers by executing load or store instructions.

The internally accessible registers in conventional processing elements include instruction registers and operand registers, which are internal to the processor core itself. These registers are ordinarily for the exclusive use of the core for the execution of operations, with the instruction registers storing the instructions currently being executed, and the operand registers storing data fetched from hardware registers 276 or other memory as needed for the currently executed instructions. These internally accessible registers are directly connected to components of the instruction execution pipeline (e.g., an instruction decode component, an operand fetch component, an instruction execution component, etc.), such that there is no reason to assign them global addresses. Moreover, since these registers are used exclusively by the processor core, they are single "ported," since data access is exclusive to the pipeline.

In comparison, the execution registers 280 of the processor core 290 in FIG. 2 may each be dual-ported, with one port directly connected to the core's micro-sequencer 291, and the other port connected to a data transaction interface 272 of the processing element 170, via which the operand registers 284 can be accessed using global addressing. As dual-ported registers, data may be read from a register twice within a same clock cycle (e.g., once by the micro-sequencer 291, and once by the data transaction interface 272).

As will be described further below, communication between processing elements 170 may be performed using packets, with each data transaction interface 272 connected to one or more busses, where each bus comprises at least one data line. Each packet may include a target register's address (i.e., the address of the recipient) and a data payload. The busses may be arranged into a network, such as the hierarchical network of busses illustrated in FIG. 1. The target register's address may be a global hierarchical address, such as identifying a multicore chip 100 among a plurality of interconnected multicore chips, a supercluster 130 of core clusters 150 on the chip, a core cluster 150 containing the target processing element 170, and a unique identifier of the individual operand register 284 within the target processing element 170.

For example, referring to FIG. 1, each chip 100 includes four superclusters 130*a*-130*d*, each supercluster 130 comprises eight clusters 150*a*-150*h*, and each cluster 150 comprises eight processing elements 170*a*-170*h*. If each processing element 170 includes two-hundred-fifty six operand registers 284, then within the chip 100, each of the operand registers may be individually addressed with a sixteen bit address: two bits to identify the supercluster, three bits to identify the cluster, three bits to identify the processing element, and eight bits to identify the register. The global address may include additional bits, such as bits to identify the processor chip 100, such that processing elements 170 may directly access the registers of processing elements across chips. The global addresses may also accommodate the physical and/or virtual addresses of a main memory accessible by all of the processing elements 170 of a chip 100, tiered memory locally shared by the processing elements 170 (e.g., cluster memory 162), etc. Whereas components external to a processing element 170 addresses the registers 284 of another processing element using global addressing, the processor core 290 containing the operand registers 284 may instead uses the register's individual identifier (e.g., eight bits identifying the two-hundred-fifty-six registers).

Other addressing schemes may also be used, and different addressing hierarchies may be used. Whereas a processor core 290 may directly access its own execution registers 280 using address lines and data lines, communications between processing elements through the data transaction interfaces 272 may be via a variety of different bus architectures. For example, communication between processing elements and other addressable components may be via a shared parallel bus-based network (e.g., busses comprising address lines and data lines, conveying addresses via the address lines and data via the data lines). As another example, communication between processing elements and other components may be via one or more shared serial busses.

Addressing between addressable elements/components may be packet-based, message-switched (e.g., a store-and-forward network without packets), circuit-switched (e.g., using matrix switches to establish a direct communications channel/circuit between communicating elements/components), direct (i.e., end-to-end communications without switching), or a combination thereof. In comparison, to message-switched, circuit-switched, and direct addressing, a packet-based conveys a destination address in a packet header and a data payload in a packet body via the data line(s).

As an example of an architecture using more than one bus type and more than one protocol, inter-cluster communications may be packet-based via serial busses, whereas intra-cluster communications may be message-switched or circuit-switched using parallel busses between the intra-cluster router (L4) 160, the processing elements 170*a* to 170*h* within the cluster, and other intra-cluster components (e.g., cluster memory 162). In addition, within a cluster, processing elements 170*a* to 170*h* may be interconnected to shared resources within the cluster (e.g., cluster memory 162) via a shared bus or multiple processing-element-specific and/or shared-resource-specific busses using direct addressing (not illustrated).

The source of a packet is not limited only to a processor core 290 manipulating the operand registers 284 associated with another processor core 290, but may be any operational element, such as a memory controller 114, a data feeder 164 (discussed further below), an external host processor connected to the chip 100, a field programmable gate array, or any other element communicably connected to a processor chip 100 that is able to communicate in the packet format.

A data feeder 164 may execute programmed instructions which control where and when data is pushed to the individual processing elements 170. The data feeder 164 may also be used to push executable instructions to the program memory 274 of a processing element 170 for execution by that processing element's instruction pipeline.

In addition to any operational element being able to write directly to an operand register 284 of a processing element 170, each operational element may also read directly from an operand register 284 of a processing element 170, such as by sending a read transaction packet indicating the global address of the target register to be read, and the global address of the destination address to which the reply including the target register's contents is to be copied.

A data transaction interface 272 associated with each processing element may execute such read, write, and reply operations without necessitating action by the processor core 290 associated with an accessed register. Thus, if the destination address for a read transaction is an operand register 284 of the processing element 170 initiating the transaction, the reply may be placed in the destination register without further action by the processor core 290 initiating the read request. Three-way read transactions may also be undertaken, with a first processing element 170*x* initiating a read transaction of a register located in a second processing element 170*y*, with the destination address for the reply being a register located in a third processing element 170*z*.

Memory within a system including the processor chip 100 may also be hierarchical. Each processing element 170 may have a local program memory 274 containing instructions that will be fetched by the micro-sequencer 291 in accordance with a program counter 293. Processing elements 170 within a cluster 150 may also share a cluster memory 162, such as a shared memory serving a cluster 150 including eight processor cores 290. While a processor core 290 may experience no latency (or a latency of one-or-two cycles of the clock controlling timing of the instruction pipeline 292) when accessing its own execution registers 280, accessing global addresses external to a processing element 170 may experience a larger latency due to (among other things) the physical distance between processing elements 170. As a result of this additional latency, the time needed for a processor core to access an external main memory, a shared cluster memory 162, and the registers of other processing elements may be greater than the time needed for a core 290 to access its own program memory 274 and execution registers 280.

Data transactions external to a processing element 170 may be implemented with a packet-based protocol carried over a router-based or switch-based on-chip network. The chip 100 in FIG. 1 illustrates a router-based example. Each tier in the architecture hierarchy may include a router. For example, in the top tier, a chip-level router (L1) 110 routes packets between chips via one or more high-speed serial busses 112a, 112b, routes packets to-and-from a memory controller 114 that manages primary general-purpose memory for the chip, and routes packets to-and-from lower tier routers.

The superclusters 130a-130d may be interconnected via an inter-supercluster router (L2) 120 which routes transactions between superclusters and between a supercluster and the chip-level router (L1) 110. Each supercluster 130 may include an inter-cluster router (L3) 140 which routes transactions between each cluster 150 in the supercluster 130, and between a cluster 150 and the inter-supercluster router (L2). Each cluster 150 may include an intra-cluster router (L4) 160 which routes transactions between each processing element 170 in the cluster 150, and between a processing element 170 and the inter-cluster router (L3). The level 4 (L4) intra-cluster router 160 may also direct packets between processing elements 170 of the cluster and a cluster memory 162. Tiers may also include cross-connects (not illustrated) to route packets between elements in a same tier in the hierarchy. A processor core 290 may directly access its own operand registers 284 without use of a global address.

Memory of different tiers may be physically different types of memory. Operand registers 284 may be a faster type of memory in a computing system, whereas as external general-purpose memory typically may have a higher latency. To improve the speed with which transactions are performed, operand instructions may be pre-fetched from slower memory and stored in a faster program memory (e.g., program memory 274 in FIG. 2) prior to the processor core 290 needing the operand instruction.

As previously discussed, tuple spaces are specified to improve the data exchanges. Aspects of the present disclosure are directed to implementing a tuple spaces via hardware to facilitate a data exchange between processors of a multiprocessor system. The tuple spaces may be implemented in cluster memory 162 or in some other memory space. Further, control of the tuple spaces may be implemented by memory controller 114. By configuring a tuple space in hardware as described below, improved data flow between processing elements may be achieved.

As is known to those of skill in the art, a tuple space may be defined as an associative memory that allows a unique named value pair write of a data value to be paired with exactly one eventual unique named value pair read. That is, the tuple space is a region of memory that stores a data word and a valid bit which indicates whether the value contained in the tuple space is valid. For example, tuple x=(data, valid). A processor may read and write to a tuple using read/write functions that are specified for the tuple space. The tuple read/write functions may stall a processor to allow for synchronization of read/writes to the tuple space. For example, if a tuple read is received for a particular tuple location prior to a write occurring to that location, the read requesting processor may be stalled until the write occurs. Thus, the tuple read/write differs from other read/write functions that do not stall the processor.

In one example, two processors may be specified in a cluster (for example processing element 0 170a and processing element 1 170b), such that one processor is a consumer and another processor is a producer. The producer 170a may process data and write the result(s) of the processed data or an address of the data to the tuple space. The consumer 170b waits for the data to be written to the tuple space and processes the data once the data or the address is written. Accordingly, the tuple space may functionally provide for the synchronization of the producer and the consumer.

In one example, the producer 170a generates a column vector that include a specific number of elements, such as 4096 data elements. The column vector may be stored in the memory associated with a cluster. The address value of the column vector and a tag associated with the column vector may be written to a tuple space to be read by the consumer 170b. The tag may be used to specify that the column vector is for a specific consumer. After generating the column vector, the producer 170a may proceed to generate another column vector.

In previous systems, tuple spaces have been implemented by software systems by using mutual exclusion protocols over the underlying memory resources. Locating the unique named value pair uses conventional software search techniques for both the write operation and the read operation. Still, locating unique named value pairs in the software implementation increases both time and power.

Aspects of the present disclosure are directed to a hardware mechanism to implement tuple spaces. The hardware implementation may free participating agents of concurrency stalls for independent reads and writes to the tuples spaces. Furthermore, in one configuration, a simplified name, such as a tag, is implemented in a content addressable memory (CAM) to reduce the search to a single digital operation (e.g., one clock cycle). That is, one read or one write is performed per clock cycle.

Conventional memory may use hard address association. For example, a request to read location 0 results in the conventional memory using the same hardware circuit to read the data at location 0. The stored data may be as wide as the memory, such as 16, 32, or 64 bits wide. Furthermore, in conventional memory, a series of read/writes to a location will always result in reading/writing to the same location. That is, the same circuit will always be activated by reading location 0.

A CAM is a type of memory that is different from the hard address association memory. In the CAM, when a processor requests to read location 0, the CAM determines if a location has been tagged with 0. The CAM may perform the read or write based on whether a location has been tagged with 0. Aspects of the present disclosure are directed to using a CAM for implementing the tuple space as hardware.

In an example system, 4096 tuple spaces may be specified, each having a specific bit width, such as 32 bits wide. (Though the number and width of the tuple spaces is configurable.) Thus, in this example system, 4096 memory locations are allocated to implement the tuple space. Still, at any one moment, only half of the processing elements (e.g., processors) may be synchronizing with the tuple space as each tuple space may only allow one interaction (either a read or a write) at any particular moment in time. Thus, as an example, if 256 processing elements are specified for a system, the CAM may be specified to configure at least 128 locations and at most 256 locations as tuple spaces. According to one aspect of the present disclosure, the number of locations configured as a tuple space is equal to the number of processing elements specified in the system. Of course, aspects of the present disclosure are not limited to the number of locations being equal to the number of processors, as more or less locations may be specified.

Furthermore, a tag may be associated with each tuple space. The tag provides a unique name for each tuple that may be used to link the tuple space with a location in the CAM. In one configuration, the number of logical tags specified for the tuple space is greater than the number of locations in the tuple space. In one configuration, a tuple space is implemented in a CAM of N×33 bits where N is the size of the tuple space, 32 bits is the size of a tuple value, and 1 bit represents the validity of the tuple (e.g., the valid (V) bit).

Figure 3:
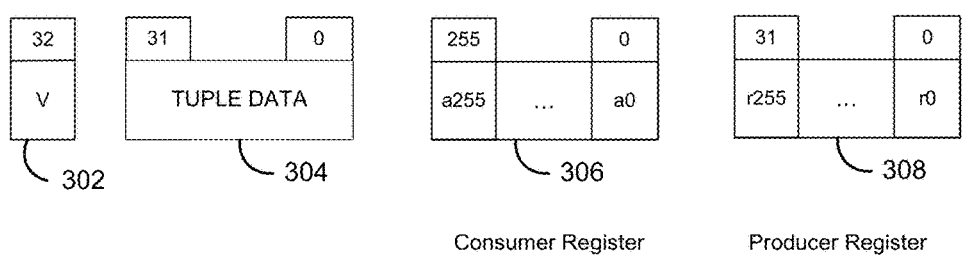
FIG. 3 illustrates an example of a tuple space according to embodiments of the present disclosure.

FIG. 3 illustrates an example of a tuple space according to aspects of the present disclosure. As shown in FIG. 3, each tuple space 304 (e.g., location in the CAM) is associated with a V-bit 302 and two waiting registries 306 308. The V-bit indicates whether the tuple is full or empty. That is, the V-bit is set to high when a write has been executed on the tuple and the V-bit is set to low after a read has been executed on the tuple. The Consumer register 306 and the Producer register 308 indicate if a processor (associated by the bit number 0-255) is waiting to either consume a tuple (i.e., read) or create a tuple (i.e., write). In one configuration, the Consumer register 306 indicates that a processor is waiting for a read and the Producer register 308 indicates that a processor is waiting to write. That is, if Consumer register 306 is populated with an address of a processor (i.e., indicating one of processor 0-255) then that processor is waiting to read. Similarly, if Producer register 308 is populated with an address of a processor (i.e., indicating one of processor 0-255) then that processor is waiting to write. As shown in FIG. 3, one bit is allocated for the V-bit 302, 32 bits are allocated for the tuple space 304, and 256 bits are allocated for each or the registries 306 308. That is, for the registries 306 308, one bit is allocated for each processor in the multiprocessor system. Of course, a multiprocessor system is not limited to 256 processors and may have more or less processors.

The Producer register and the Consumer register are examples of registers used to indicate that a processing unit is waiting to perform a read or a write. Aspects of the present disclosure are not limited to using the Producer register and the Consumer register as other indicators may be used to indicate that a processing unit is waiting to perform a read or a write. For example, different flags may be specified to indicate that a processing unit is waiting to perform a read or a write. In the present application, the Producer register and the Consumer register may be referred to as flags.

Figure 4A:
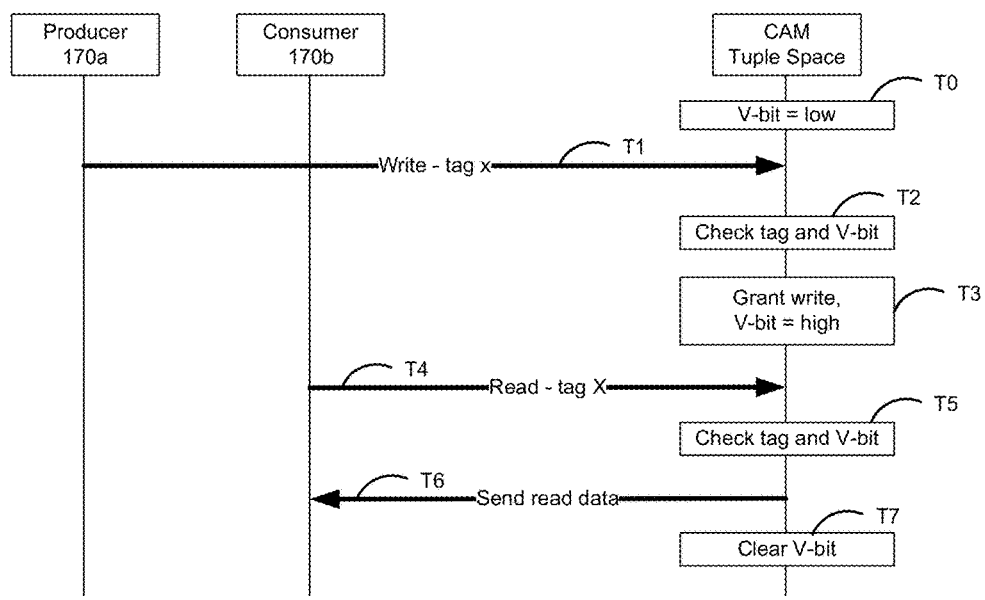

FIG. 4A illustrates a timing diagram for a multiprocessing system according to aspects of the present disclosure. As shown in FIG. 4A, the system includes multiple processor elements producer 170a, consumer 170b, and a CAM tuple space. As previously discussed, the CAM may be specified to synchronize read/writes between processors 170a-170b. As an example, as shown in FIG. 4A, a first processor 170a may be processing data that is desired by a second processor 170b. The first processor 170a may be faster or slower than the second processor 170b, thus, it is desirable to synchronize the operations via a CAM. In the present example, the first processor 170a is referred to as a producer due to it being the writing processor and the second processor 170b is referred to as a consumer due to it being the consuming processor.

The following is an example of code for a consumer and a producer according to an aspect of the present disclosure:

```
Producer Code
main_loop:
    ; [performs some work]
    src_reg = do_some_work( )
    ;[write result to tuple]
    WRTUPLE addr_tup, src_reg
    JMP main_loop
Consumer Code
main_loop:
    ; [read result from tuple]
    RDTUPLE addr_tup, dst_reg
    ; [perform additional work]
    do_additional_work (dst_reg)
    JMP main_loop
```

Figure 4C:
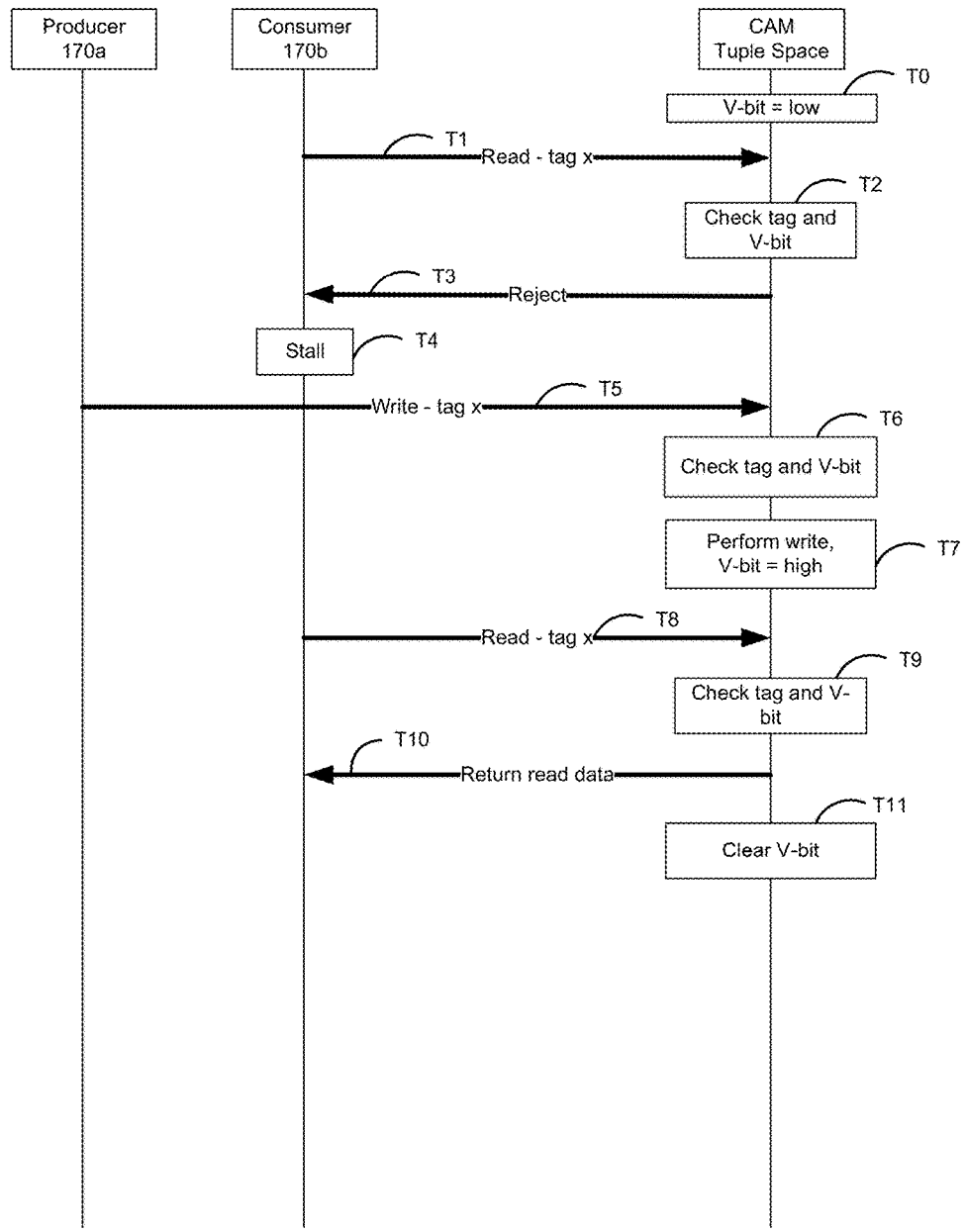

As shown in FIG. 4A, based on the example code provide above, at the start of the program (e.g., time T1), the first processor 170a executes a write request (e.g., WRTUPLE) when the V-bit is low (time T0) and before the second processor 170b executes the read request (e.g., RDTUPLE). The write request includes a location of the data to be written (e.g., src_reg) and a tag (e.g., addr_tup). In FIGS. 4A-4C, for illustrative purposes, the tag associated with each read/write request is shown is tag x. Upon receiving the write request, at time T2, the CAM determines if the tag (e.g., destination address) associated with write request exists as a tuple space in the CAM. If the tag exists, at time T2, the CAM (e.g., tuple logic) determines whether a V-bit associated with the tag is low or high. If the V-bit is low, at time T3, the write request is granted, such that data from the first processor 170a is placed at the location, and the corresponding V-bit is set high.

In the present example, after receiving the write request (time T1), if the tag does not exist, the CAM associates the tag with a location and sets the V-bit to low (not shown). In this example, the V-bit is low because the location associated with the tag did not exist (i.e., the location was empty). Once the location has been associated with the tag, the write is granted and the corresponding V-bit is set high (time T3). After writing the data, the first processor 170a jumps to the top of the loop to process the next data set.

Furthermore, as shown in FIG. 4A, at time T4, the second processor 170b may execute a read request including a tag (e.g., addr_tup) and a destination for the read data (e.g., dst_reg). Upon receiving the read request, at time T5, the CAM determines if a location is associated with the read request. If the location exists, the CAM determines if the V-bit is high or low. In this example, the V-bit is set to high (i.e., the location has been written to), thus, the data from the address is retrieved to the second processor 170b (time T6) and the V-bit is cleared (e.g., set to low) (time T7). After receiving the data, the second processor 170b processes the data and jumps to the top of the loop to read the next tuple.

In some cases, the first processor 170a may be faster than the second processor 170b. As shown in FIG. 4B, the first processor has requested a write (time T1) when the V-bit is low (time T0). Furthermore, at times T2 and T3, the CAM has determined that the V-bit is low and granted the write. Additionally, as shown in FIG. 4B, at time T4, the first processor 170a is performing a subsequent write, to the same write location from time T1 (e.g., tag x), when the V-bit is high. That is, the first processor 170a is attempting to overwrite a location before the second processor 170b has executed a read from the location.

At time T5, the CAM checks that tag and V-bit. Because the V-bit is high (time T3), at time T6, the CAM rejects the write request and causes the first processor 170a to stall (time T7). The first processor 170a is stalled because a write cannot be performed on a location with a high V-bit. In one configuration, when the CAM rejects the write request, a flag, such as the Producer register, is set to indicate that the first processor 170a is waiting to perform a write to the location. Additionally, as shown in FIG. 4B, while the first processor 170a is stalled, the second processor 170b may execute a read request (time T8). Based on the read request, at time T9, the CAM checks the tag and the V-bit. In this example, the V-bit is high, therefore, that the data is returned to the second processor 170b (time T10) and the V-bit is cleared (time T11). Furthermore, after clearing the V-bit, a signal (not shown) may be sent to the first processor 170a indicating that first processor 170a may repeat the write request. The signal may be sent based on the flag indicating that the first processor 170a is waiting to write to the location. In response to the signal, the first processor 170a may repeat the write request (time T12). In response to the repeated write request, at time T13, the CAM checks the tag and V-bit. Because the V-bit is clear (e.g., low), the write request is granted and the V-bit is set to high when the write is complete (time T14).

In another example, the second processor 170b may be faster than the first processor 170a. Thus, as shown in FIG. 4C, at time T1, the second processor 170b may be executing a read request before the first processor 170a has executed the write, such that the V-bit is low (time T0) because a write has not been performed at the location associated with the tag. That is, the second processor 170b may try to read an empty (e.g., invalid) address. After receiving the read request at time T1, the CAM determines if a location (e.g., source address) is associated with tag request (time T2). If the location is associated with the tag, at time T2, the CAM (e.g., tuple logic) determines whether a V-bit associated with the location is low or high. As previously discussed, in this example, the V-bit is low. Therefore, at time T3, the CAM rejects the read request and the second processor 170b is stalled at time T4. In one configuration, when the CAM rejects the read request, a flag, such as the Consumer register, is set to indicate that the second processor 170b is waiting to perform a read from the location. While the second processor 170b is stalled, at time T5, the first processor 170a may write to the location. At time T6, the CAM determines if the location (e.g., destination address) is associated with tag of the write request and whether a V-bit associated with the location is low or high. In this case, because the V-bit is low, the write is granted and the V-bit is set to high (time T7).

After the write is granted, a signal (not shown) may be sent to the second processor 170b indicating that second processor 170b may repeat the read request. The signal may be sent based on the flag indicating that the second processor 170b is waiting to read from the location. In response to the signal, the stalled second processor 170b repeats the original read request (time T8). Again, at time T9, the CAM determines if the location (e.g., source address) is associated with the tag of the read request and whether a V-bit associated with the tag is low or high. In this case, because the V-bit is high, the read is granted (time T10) and the V-bit is cleared (time T11).

Finally, in the present example, if a location is not associated with the tag of the read request, the CAM associates a location with the tag and sets the V-bit to low (not shown). Furthermore, because the location is empty, the CAM rejects the read request (time T3) and stalls the second processor 170b (time T4) until a write is performed to the location associated with the tag. As discussed above, while the second processor 170b is stalled (time T4), the first processor 170a may write (time T5) to the location and the V-bit is set to high (time T7). After the write is executed, the stalled second processor 170b may repeat the original read request (time T8) and the V-bit may be cleared after the read is performed (time T11).

Figure 5:
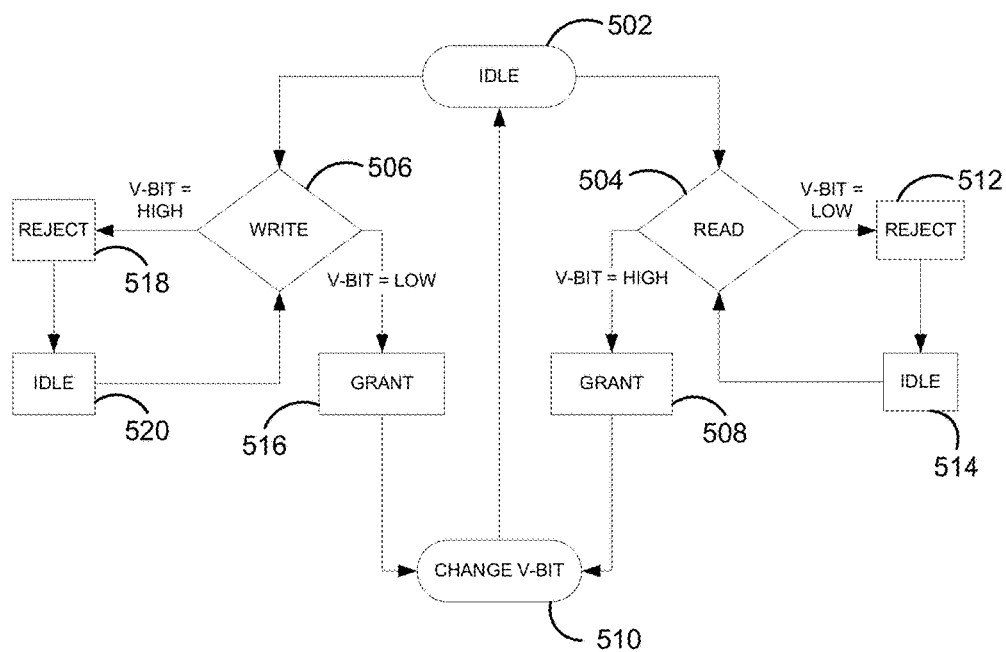
FIG. 5 illustrates an example of a flow diagram for implementing a tuple space according to embodiments of the present disclosure.

FIG. 5 illustrates a flow diagram 500 for reading and writing from locations in a CAM. As shown in FIG. 5, at block 502 the CAM is idle. While idle, the CAM may receive a read request (block 504) or a write request (block 506). As previously discussed, each read request and write request includes a tag.

Upon receiving a read request, the CAM determines whether a location associated with a tag exists. If the location exists, the CAM determines whether the V-bit is set to low or high. If the V-bit is set to high, the CAM grants the read (block 508) which causes the data in the location (e.g., tuple data) to be latched to the consumer. Furthermore, after granting the read, the CAM changes the V-bit associated with the location (block 510). Finally, the CAM returns to the idle phase (block 502) and the consumer jumps to the top of the loop to read the next tuple.

As previously discussed, after a read is performed, the CAM changes the V-bit so that the V-bit is cleared. In one configuration, when the V-bit is cleared, based on a flag associated with the location, the CAM determines whether a producer is waiting to write to the location. If a producer is waiting, a retry signal is transmitted to the producer to repeat a write request (block 506).

Furthermore, as shown in FIG. 5, for the read request, if the V-bit is set to low, the CAM rejects the request (block 512) and causes the consumer to enter an idle mode (block 514). In one configuration, when in an idle mode (e.g., stalled), a processor may enter a low power state. Alternatively, if the location associated with a tag of the read request does not exist, the CAM associates the tag with an empty location, rejects the request (block 512), and causes the consumer to enter an idle mode (block 514). When the consumer is set to idle at block 514, a flag associated with the location is set to indicate that the consumer is waiting to read from the location. Furthermore, after a write is performed to the location, a retry signal may be sent to the consumer to retry the original read request (block 504). The retry signal may be sent based on the set flag.

Additionally, as shown in FIG. 5, upon receiving a write request, the CAM determines whether a location associated with a tag exists. If the location exists, the CAM determines whether the V-bit is set to low or high. If the V-bit is set to low, the CAM grants the write (block 516) which causes the data associated with the write to be written to the location (e.g., tuple space). Alternatively, if the location does not exist, the CAM finds an empty location and associates the location with the tag. After associating the empty location with the tag, the write request is granted (block 516). Furthermore, after granting the write, the CAM changes the V-bit associated with the location (block 510). Finally, the CAM returns to the idle phase (block 502) and the producer jumps to the top of the loop to read the next tuple.

As previously discussed, after a write is performed, the CAM sets the V-bit associated with the location to high. In one configuration, after the V-bit is set to high, based on a flag associated with the location, the CAM may determine whether a consumer is waiting to read from the location. If a consumer is waiting, a retry signal is transmitted to the consumer to repeat a write request (block 504).

Furthermore, as shown in FIG. 5, for the write request, if the V-bit is set to high, the CAM rejects the request (block 518) and causes the producer to enter an idle mode (block 520). When the producer is set to idle at block 520, a flag associated with the location is set to indicate that the producer is waiting to write to the location. Furthermore, after a read is performed to the location, a retry signal may be sent to the producer to retry the original write request. The retry signal may be sent based on the set flag.

According to an aspect of the present disclosure, tuple space addressing uses an architectural address to specify a cluster specific tuple space, device specific tuple space, board specific tuple space, chassis specific tuple space, and a global tuple space.

An example architectural address from the perspective of a processing element is provided in TABLE 1. As shown in TABLE 1, the cluster specific tuple space is not addressable by any other cluster or device, whereas the device specific tuple space is addressable by any cluster on that device but is not addressable by any other device. The board and chassis specific tuple spaces are similarly constrained, whereas the global tuple space is addressable by all devices. As shown in the Selection column of TABLE 1, the tuple space may be defined in various locations, such as a device specific tuple space, a board specific tuple space, and a rack tuple space, etc. Still, the tuple spaces are not limited to being defined in the areas specified in TABLE 1, as tuple spaces may be configured in any platform with multiple processors. Additionally, a tuple space may be defined for specific cluster groups, such as only odd numbered clusters or only even numbered clusters. A cluster may refer to a grouping of processing elements. In one configuration, a cluster is a grouping of eight processing elements.

TABLE 1

| Address | Selection |
| --- | --- |
| 0xF8020000 | Reserved for Cluster Specific Tuple Space |
| 0xF8021000 | Reserved for 4-Cluster Specific Tuple Space |
| 0xF8022000 | Reserved for 8-Cluster Specific Tuple Space |
| 0xF8023000 | Reserved for 16-Cluster Tuple Space |
| 0xF8024000 | Reserved for Device Specific Tuple Space |
| 0xF8028000 | Reserved for Board Specific Tuple Space |
| 0xF802C000 | Reserved for Chassis Specific Tuple Space |
| 0xF802D000 | Reserved for Rack Tuple Space |
| 0xF802E000 | Reserved for Global Tuple Space |

Figure 6A:
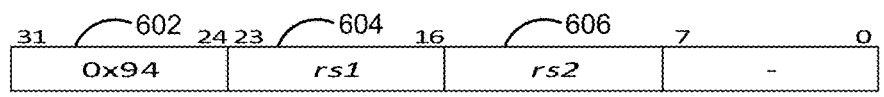
FIGS. 6A-6B illustrate examples of read requests and write requests according to embodiments of the present disclosure.
Figure 6B:
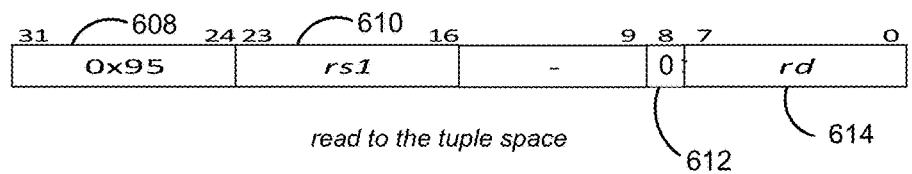

FIG. 6A illustrates an example of a write request (e.g., write instruction) according to an aspect of the present disclosure. As shown in FIG. 6A, a write request includes a tuple space identifier 604 (e.g., tag), the data 606, and an instruction code 602. As shown in FIG. 6A, in one example, the write request is 32 bits. For example, in FIG. 6A the instruction code 0x94 is specified for a write operation. Furthermore, FIG. 6B illustrates an example of a read request (e.g., read instruction) according to an aspect of the present disclosure. As shown in FIG. 6B, in one example, the read request is 32 bits. As shown in FIG. 6B, a read request includes a tuple space identifier 610 (e.g., tag), a location to place the data 614, an instruction code 608, and a clear bit 612. When the clear bit is not set, the reader may see the data without receiving the data, such that the data is not actually read from the tuple space. When the clear bit is set, the reader performs an actual read such that the data is read from the tuple space. The clear bit may be specified to see the data without reading the data when a processor is monitoring information and does not want to interfere with a read of another processor.

Aspects of the present disclosure have been presented for a CAM in a multiprocessor system. Still, aspects of the present disclosure are also contemplated for using a CAM to synchronize a data exchange between multiple devices.

Figure 7:
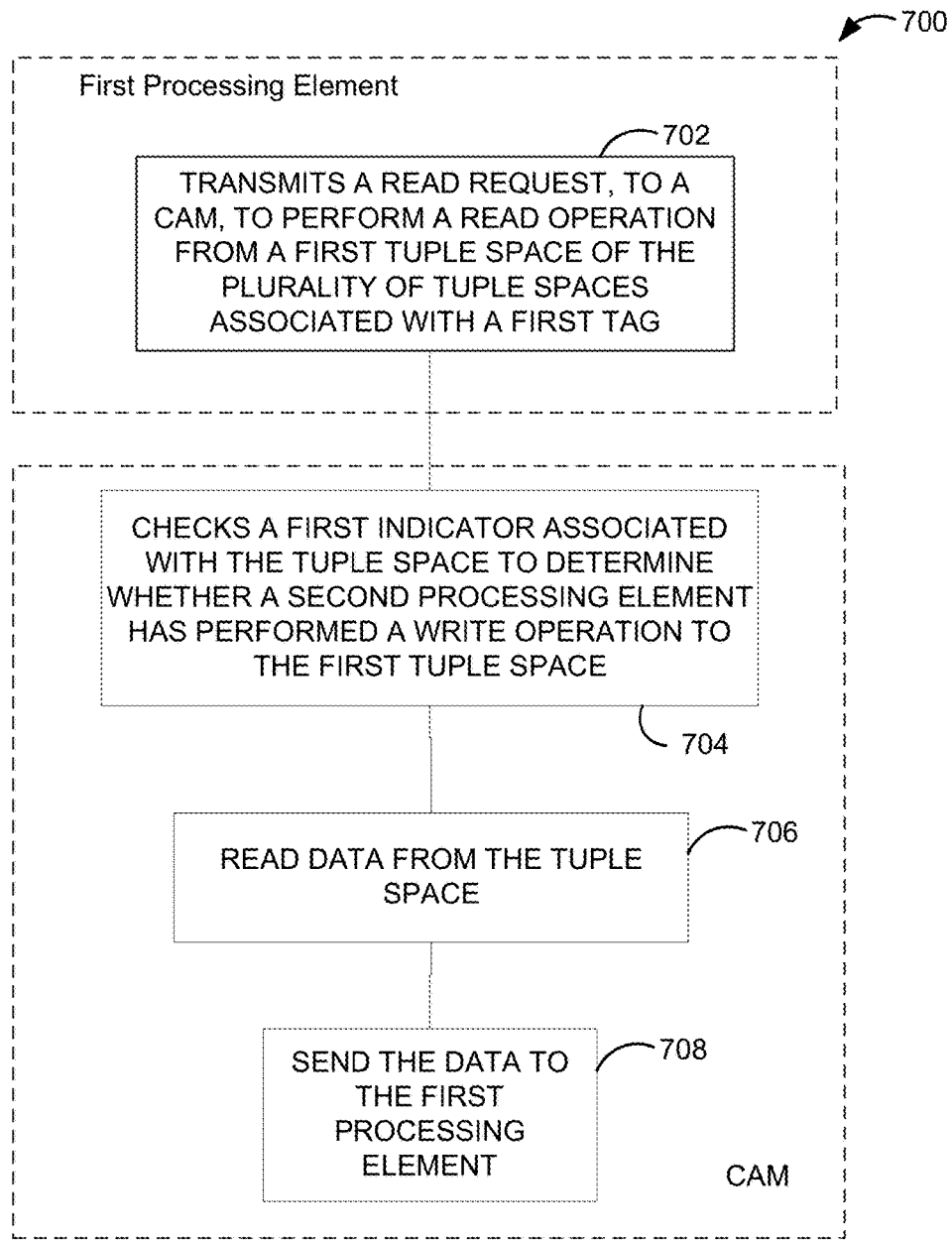
FIG. 7 illustrates an example of a hardware diagram for a content addressable memory (CAM) according to embodiments of the present disclosure.

FIG. 7 illustrates a method 700 for implementing a tuple space according to aspects of the present disclosure. In block 702, a first processing element transmits a read request, to a CAM, to perform a read operation from a tuple space of the plurality of tuple spaces associated with a first tag. Furthermore, in block 704, the CAM checks a first indicator associated with the tuple space to determine whether a second processing element has performed a write operation to the first tuple space. Additionally, in block 706, the CAM reads data from the tuple space. Finally, in block 708, the CAM sends the data to the first processing element.

Figure 8:
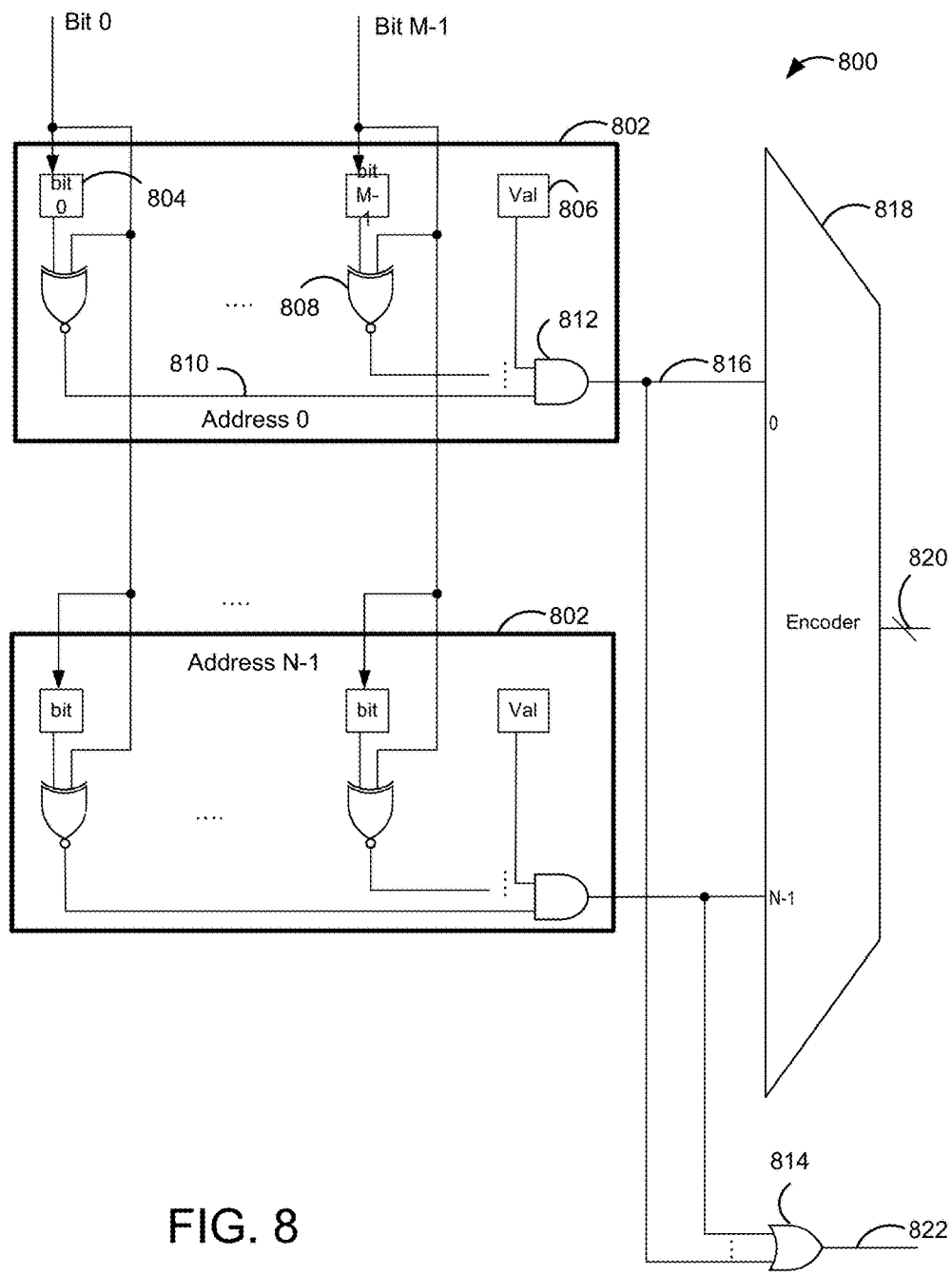
FIG. 8 illustrates an example of a content addressable memory (CAM) for implementing a tuple space according to embodiments of the present disclosure.

FIG. 8 illustrates an example of a CAM 800 according to an aspect of the present disclosure. As shown in FIG. 8, the CAM 800 includes N addresses 802. In one example, as shown in FIG. 8, the N addresses are numbered 0 to N−1. Each address 802 may correspond to a tuple space. Furthermore, each address 802 may store an M bit value in the bits 804. Furthermore, as shown in FIG. 8, the bits 804 may receive data via inputs 0 to M−1.

In one configuration, the CAM 800 receives a write request including M bits of data to be written. When the CAM receives the data, the M bits of received data are compared to the values stored in the bits 804 of each address 802. That is, each received bit 0 to M−1 and each stored bit 0 to M−1 are input to an XNOR gate 808. Furthermore, each XNOR gate 808 outputs a result of the comparison to a bit line 810. If an XNOR gate 808 outputs high to the bit line 810, the received bit matched the stored bit 804. Alternatively, if an XNOR gate 808 outputs low to the bit line 810, the received bit of the data did not match the stored bit 804.

Each bit line 810 is input to an AND gate 812 corresponding to an address 802. Furthermore, a VAL bit 806 is also input to the AND gate 812 corresponding to an address 802. Each VAL bit 806 may be used to indicate whether an address 802 is clear. For example, when the M bits stored in an address 802 are read (e.g., output from the address 802), the VAL bit 806 is cleared (e.g., set to 0) to indicate that the address 802 does not contain data.

In one configuration, when the VAL bit 806 is clear, the output from an AND gate 812 is low, indicating that there is no match. When there is an indication of no match, the data may be written to an address 802 if the address is clear. Furthermore, after data is written to the bits 804 of an address 802, the VAL bit 806 is set to high so that the address 802 may participate in data searches. That is, if all of the bit lines 810 of an address 802 are high and the VAL bit 806 is high, then the AND gate 812 of the address 802 outputs high on the match signal 816 indicating a match.

Based on the match signal 816 indicating a match, an encoder 818, such as a MUX, determines which address 802 of the multiple addresses 802 indicated a match and outputs match address 820 corresponding to the address 802 that indicated a match. Furthermore, an OR gate 814 sets a match line 822 high when one of the addresses 802 indicates a match. Additionally, if all of the match signals 816 are low, the OR gate 814 sets a match line 822 low to indicate that a match was not found.

In one configuration, the a processor chip 100 or a processing element 170 includes means for configuring, means for receiving, means for checking, means for reading, and/or means for sending. In one aspect, the aforementioned means may be the cluster memory 162, data feeder 164, memory controller 114, CAM 800 and/or program memory 27 configured to perform the functions recited by the means for configuring, means for receiving, means for checking, means for reading, and/or means for sending. As an example, the means for receiving may be the bit lines 0 to M–1 of the CAM 800. As another example, the means for checking may be the addresses 802, XNOR gates 808, AND gates 812, and/or encoder 818 of the CAM 800. In another aspect, the aforementioned means may be any module or any apparatus configured to perform the functions recited by the aforementioned means.

Embodiments of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers, microprocessor design, and network architectures should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Conjunctive language such as the phrase "at least one of X, Y and Z," unless specifically stated otherwise, is to be understood with the context as used in general to convey that an item, term, etc. may be either X, Y, Z, or a combination thereof. Thus, such conjunctive language is not generally intended to imply that certain embodiments require at least one of X, at least one of Y, and at least one of Z to each is present.

As used in this disclosure, the term "a" or "one" may include one or more items unless specifically stated otherwise. Further, the phrase "based on" is intended to mean "based at least in part on" unless specifically stated otherwise.

What is claimed is:

1. A multiprocessor integrated on a semiconductor chip, comprising:
   a first processing element;
   a second processing element; and
   a content addressable memory (CAM) comprising a plurality of tuple spaces, wherein the CAM is configured to:
   receive a read request from the first processing element, the read request including a first tag and an instruction to perform a read operation from a first tuple space of the plurality of tuple spaces, the first tuple space being associated with the first tag;
   receive a write request from the second processing element, the write request including the first tag and an instruction to perform a write operation to the first tuple space;
   write data associated with the write request to the first tuple space;
   based at least in part on writing the data, set a first indicator associated with the first tuple space;
   after writing the data, determine that the first indicator is set;
   based at least in part on the first indicator being set, read the data from the first tuple space; and
   send the data to the first processing element.

2. The multiprocessor integrated on a semiconductor chip of claim 1, wherein:
   the read request comprises the first tag; and
   the CAM is further configured to determine whether the first tuple space is associated with the first tag prior to determining the first indicator is set.

3. The multiprocessor integrated on a semiconductor chip of claim 2, wherein the CAM is further configured to:
   clear, after the data is read, the first indicator associated with the first tuple space.

4. The multiprocessor integrated on a semiconductor chip of claim 2, wherein the CAM is further configured to:
   after receiving the read request and prior to writing the data, determine that the first indicator is not set; and
   based on determining the first indicator is not set, stall the read request until the first indicator indicates that the second processing element has performed the write operation to the first tuple space.

5. The multiprocessor integrated on a semiconductor chip of claim 4, wherein the first processing element is configured to remain idle until the first indicator indicates that the second processing element has performed the write operation to the first tuple space.

6. The multiprocessor integrated on a semiconductor chip of claim 1, wherein the CAM is further configured to:
   receive, from a third processing element, a write request associated with a second tag and second data; and
   determine whether a second tuple space of the plurality of tuple spaces is associated with the second tag.

7. The multiprocessor integrated on a semiconductor chip of claim 6, wherein the CAM is further configured to:
   associate the second tag to the second tuple space when the second tuple space is not associated with the second tag; and
   store the second data at the second tuple space.

8. The multiprocessor integrated on a semiconductor chip of claim 6, wherein the CAM is further configured to block the write request when a second indicator indicates that a read operation has not been performed on the second tuple space.

9. The multiprocessor integrated on a semiconductor chip of claim 8, wherein the third processing element is configured to remain idle until the second indicator indicates that a read operation has been performed on the second tuple space.

10. The multiprocessor integrated on a semiconductor chip of claim 1, wherein, in response to the first indicator initially indicating that the second processing element has not performed the write operation, the CAM is configured to:
before determining that the first indicator is set, send a message to the first processing element that the first tuple space is not ready for reading;
receive a later request from the second processing element to write the data to the first tuple space;
write the data to the first tuple space; and
set the first indicator to indicate that the first tuple space is ready for reading.

11. A computer implemented method, the method comprising:
configuring, in a content addressable memory (CAM), a plurality of locations as a plurality of tuple spaces;
receiving, at the CAM, a read request from a first processing element, the read request including a first tag and an instruction to perform a read operation from a first tuple space of the plurality of tuple spaces, the first tuple space being associated with the first tag;
receiving, at the CAM, a write request from a second processing element, the write request including the first tag and an instruction to perform a write operation to the first tuple space;
writing, at the CAM, data associated with the write request to the first tuple space;
based at least in part on writing the data, setting a first indicator associated with the first tuple space;
after writing the data, determining that the first indicator is set;
based at least in part on the first indicator being set, reading, at the CAM, the data from the first tuple space; and
sending, from the CAM, the data to the first processing element.

12. The computer implemented method of claim 11, wherein:
the read request comprises the first tag; and
the CAM is further configured to determine whether the first tuple space is associated with the first tag prior to determining the first indicator is set.

13. The computer implemented method of claim 12, wherein the computer implemented method further comprises clearing, after the data is read, the first indicator associated with the first tuple space.

14. The computer implemented method of claim 12, wherein the computer implemented method further comprises:
after receiving the read request and prior to writing the data, determining that the first indicator is not set; and
based on determining the first indicator is not set, stalling the read request when the first indicator indicates that the second processing element has not performed the write operation to the first tuple space.

15. The computer implemented method of claim 14, wherein the first processing element is configured to remain idle until the first indicator indicates that the second processing element has performed the write operation to the first tuple space.

16. The computer implemented method of claim 11, wherein the computer implemented method further comprises:
receiving, from a third processing element, a write request associated with a second tag and second data; and
determining whether a second tuple space of the plurality of tuple spaces is associated with the second tag.

17. The computer implemented method of claim 16, wherein the computer implemented method further comprises:
associating the second tag to the second tuple space when the second tuple space is not associated with the second tag; and
storing the second data at the second tuple space.

18. The computer implemented method of claim 16, wherein the computer implemented method further comprises blocking the write request when a second indicator indicates that a read operation has not been performed on the second tuple space.

19. The computer implemented method of claim 18, wherein the third processing element is configured to remain idle until the second indicator indicates that a read operation has been performed on the second tuple space.

20. An apparatus integrated on a semiconductor chip, the apparatus comprising:
means for configuring a plurality of memory locations as a plurality of tuple spaces;
means for receiving a read request from a first processing element, the read request including a first tag and an instruction to perform a read operation from a first tuple space of the plurality of tuple spaces, the first tuple space being associated with the first tag;
means for receiving a write request from a second processing element, the write request including the first tag and an instruction to perform a write operation to the first tuple space;
means for writing data associated with the write request to the first tuple space;
means for, based at least in part on writing the data, setting a first indicator associated with the first tuple space;
means for, after writing the data, determining that the first indicator is set;
means for, based at least in part on the first indicator being set, reading the data from the first tuple space; and
means for sending the data to the first processing element.

* * * * *